United States Patent
Wang et al.

(10) Patent No.: US 11,128,307 B2
(45) Date of Patent: Sep. 21, 2021

(54) CIRCUIT AND METHOD FOR CONTROL OF COUNTER START TIME

(71) Applicant: OmniVision Technologies, Inc., Santa Clara, CA (US)

(72) Inventors: Rui Wang, San Jose, CA (US); Yu-Shen Yang, San Jose, CA (US); Shan Chen, Sunnyvale, CA (US); Min Qu, Mountain View, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/175,586

(22) Filed: Oct. 30, 2018

(65) Prior Publication Data

US 2020/0136630 A1    Apr. 30, 2020

(51) Int. Cl.

| | |
|---|---|
| *H03M 1/00* | (2006.01) |
| *H03M 1/06* | (2006.01) |
| *H04N 5/361* | (2011.01) |
| *H04N 5/376* | (2011.01) |
| *H04N 5/369* | (2011.01) |
| *H04N 5/378* | (2011.01) |

(52) U.S. Cl.
CPC ......... *H03M 1/002* (2013.01); *H03M 1/0607* (2013.01); *H04N 5/361* (2013.01); *H04N 5/36963* (2018.08); *H04N 5/378* (2013.01); *H04N 5/3765* (2013.01)

(58) Field of Classification Search
CPC .......................... H03M 1/002; H03M 1/0607; H04N 5/36963; H04N 5/361; H04N 5/3765; H04N 5/378
See application file for complete search history.

(56) References Cited

U.S. PATENT DOCUMENTS

| | | | | |
|---|---|---|---|---|
| 4,092,726 A | * | 5/1978 | Schoeff | H03M 1/447 341/118 |
| 4,195,235 A | * | 3/1980 | Schoeff | H03M 1/52 327/103 |
| 6,226,562 B1 | * | 5/2001 | Philpott | G11C 29/028 324/426 |
| 2018/0184023 A1 | | 6/2018 | Sato et al. | |

OTHER PUBLICATIONS (ROC) Taiwan Patent Application No. 108135650—Office Action with English translation dated May 5, 2020, 15 pages.
ROC (Taiwan) Patent Application No. 108135650—Rejection Decision with English translation dated Sep. 4, 2020, 8 pages.

* cited by examiner

*Primary Examiner* — Antoinette T Spinks

(74) *Attorney, Agent, or Firm* — Christensen O'Connor Johnson Kindness PLLC

(57) ABSTRACT

An analog to digital conversion (ADC) circuit includes a ramp circuit coupled to output a ramp signal, and the ramp signal is offset from a starting voltage by an offset voltage. The ramp signal ramps towards the starting voltage. A counter circuit is coupled to the ramp circuit to start counting after the ramp signal returns to the starting voltage, and a comparator is coupled to the counter circuit and a bitline to compare the ramp signal to a pixel signal voltage on the bitline. In response to the ramp signal equaling the pixel signal voltage, the comparator stops the counter.

20 Claims, 5 Drawing Sheets

CIRCUIT AND METHOD FOR CONTROL OF COUNTER START TIME

TECHNICAL FIELD

This disclosure relates generally to electronic devices, and in particular but not exclusively, relates to analog to digital converters.

BACKGROUND INFORMATION

Image sensors have become ubiquitous. They are widely used in digital still cameras, cellular phones, security cameras, as well as medical, automobile, and other applications. High dynamic range (HDR) image sensors have been required by many of those applications. Human eyes normally possess a dynamic range of up to about 100 dB. For automobile applications, an image sensor of more than 100 dB dynamic range may be necessary to deal with different driving conditions, such as driving through a dark tunnel into bright sunlight.

When image sensors are used, photo-generated electrons in each of the plurality of pixel cells are transferred from the photodiode to a floating diffusion for subsequent readout. The image signal on the floating diffusion is amplified by a source follower transistor. When a row select transistor is enabled, the amplified image signal is transferred to an output line, called a bitline, of the pixel cell.

The image signal on the bitline is normally fed into an analog to digital converter (ADC) to be converted to digital image signal. A ramp type ADC is often used in association with image sensors.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
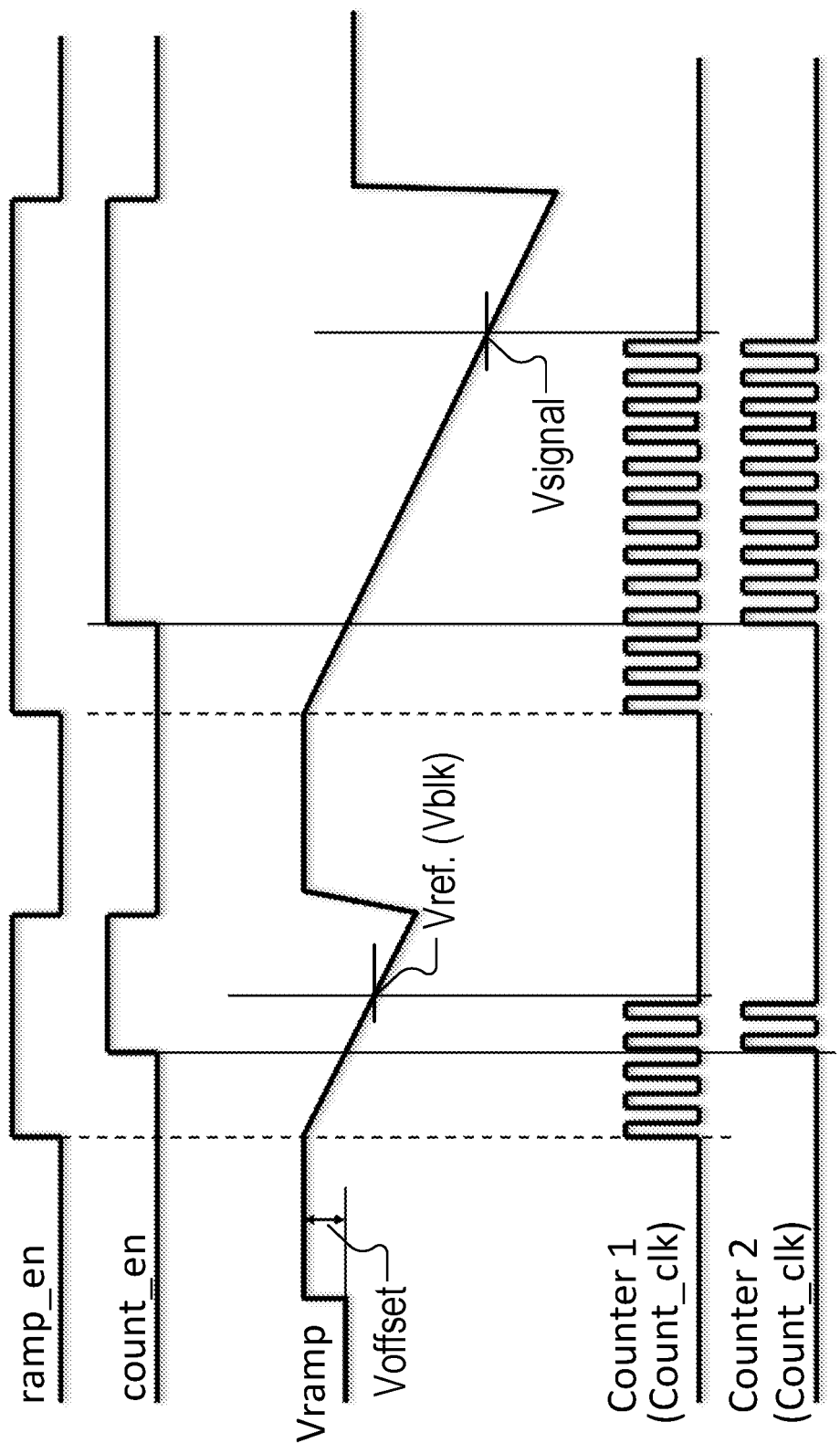
FIG. 1 shows two timing diagrams for an analog to digital converter, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for control of a counter start time are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

FIG. 1 shows two timing diagrams for an analog to digital converter for a "double ramp" structure (e.g., for correlated double sampling), in accordance with the teachings of the present disclosure. Here, a counter starts counting (see e.g., "counter 1") when a ramp signal starts ramping, and the counter stops counting when the ramp signal voltage equals the voltage on a bitline from an image sensor pixel. Power consumed by a counter is roughly proportional to the number of counts that the counter produces. Thus, the fewer times the counter needs to count the more power that will be saved.

As shown in FIG. 1, the system here adds an offset ("Voffset") on Vramp to cover nonlinearity caused by the delay of a comparator and Vramp. This causes extra power to be consumed by the counter (see e.g., "counter 1" starting to count when the ramp signal starts). The number of counts to cover the offset voltage with the ramp signal is usually about 300-700 counts (depicted here as three counts for the sake of brevity). Compared to the effective signal count range of 1023 in 10-bit counter, the proportion of the counts output to cover Voffset to the total number of counts is not small. In an image sensor, there is a counter in each column, and all columns are counted in parallel (see e.g., FIG. 3). The total power consumption of these parallel counters is a significant portion of the total power consumption of the image sensor system. Accordingly, here a system in accordance with the teachings of the present disclosure eliminates counts caused by the offset voltage, thus saving power (see e.g., "counter 2" starting to count only after Vramp returns to the starting voltage).

The system starts the counter at a later time (see e.g., "counter 2") to account for the offset voltage, in accordance with the teachings of the present disclosure. This saves an appreciable amount of power. Both the ramp reference signal (Vref) and ramp image signal ("Vsignal") from the pixel may be delayed for the same amount of time, so the delay of count_en won't affect the final readout data. Thus in one example, for 300DN delayed counter_en, the system saves about ⅓ counter power in the dark condition (e.g., when the image sensor is not receiving light).

As stated, the power consumption of a counter is almost proportional to its final number of counts. In a dark condition, the power consumption of image data follows a Gaussian (bell-curve-like) distribution. When plotted as a histogram, the output data will have a median count "Median$_{dark}$" (i.e., the value at the center of the bell curve), and a minimum value of "Min$_{dark}$" (i.e., the value at the start of the bell curve). The power consumption of the counter is proportional to Median$_{dark}$. Here, the system starts counting at a later time, so that Min$_{dark}$ is almost 0. The power consumption of the new timing is proportional to (Median$_{dark}$−Min$_{dark}$). And compared to previous timing (e.g., "counter 1"), the average power saving ratio is (Min$_{dark}$)/(Median$_{dark}$).

As an example, when the median is 390, and the min is 300, the system here saves 76% counting power for the first ramp. For an image average around 512, the system here saves about 300/(390+512)=33% counting power for the second ramp. For digital correlated double sampling (CDS) operation, the average power savings of both count reference and count signal is: (300+300)/(390+390+512)=46.4%. Thus, if digital power were ~50% of total power and counter power were ~20% of digital power, then in the dark condition, the system here could save 4.6% of total power.

As shown, the techniques disclosed herein may be used with correlated double sampling so that the counter starts counting later for both the black level reference voltage (e.g., "Vref" in FIG. 1) and for the image signal voltage (e.g., "Vsignal" in FIG. 1) as indicated in Vpixel. After analog to digital conversion, the reference signal may be subtracted from the image signal to yield an image signal that has been corrected for dark current or the like.

Figure 2A:
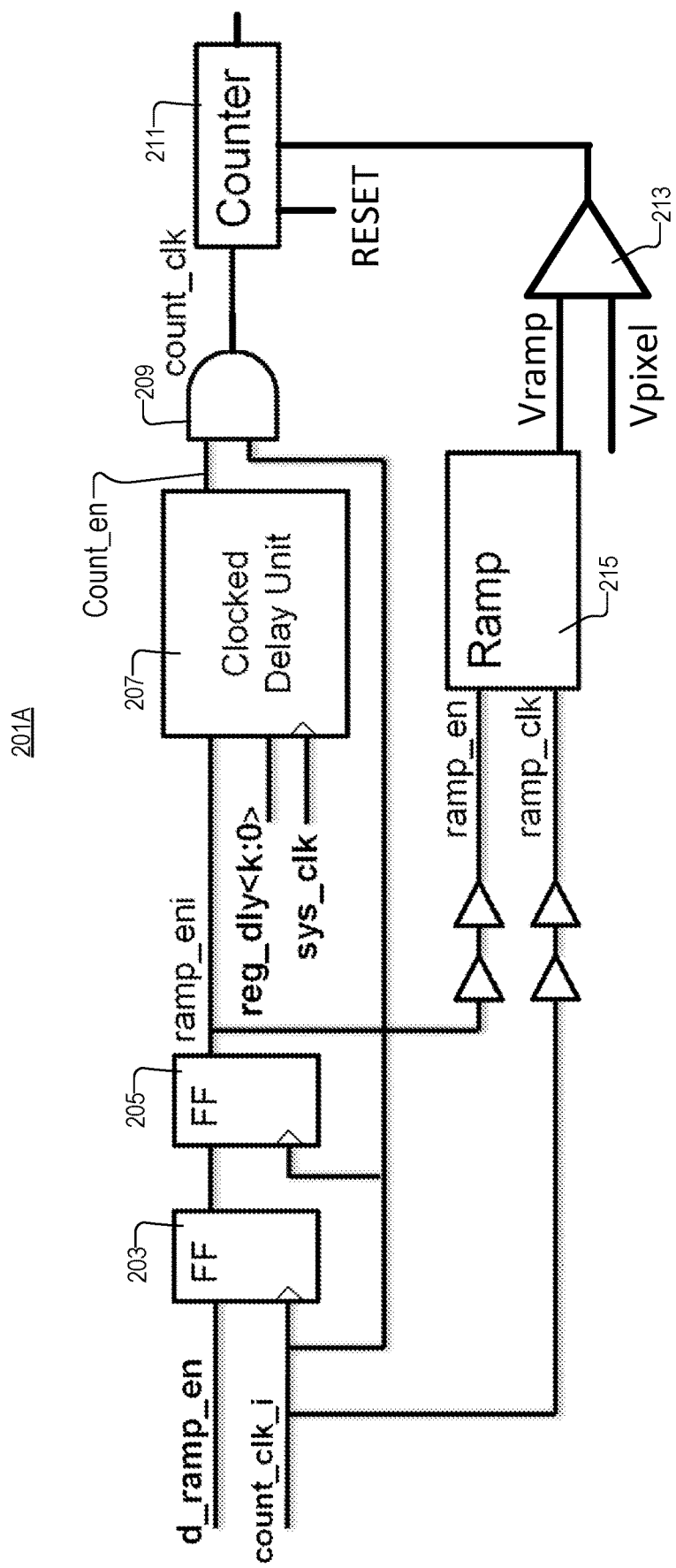
FIG. 2A shows part of an analog to digital converter circuit which may generate the waveforms of FIG. 1, in accordance with the teachings of the present disclosure.

FIG. 2A shows part of an analog to digital converter circuit 201A, which may generate the waveforms of FIG. 1, in accordance with the teachings of the present disclosure. Analog to digital converter circuit 201A includes first flip flop 203, second flip flop 205, clocked delay unit 207, AND gate 209, counter 211, comparator 213, and ramp circuit 215. An output of first flip flop 203 is coupled to an input of second flip flop 205, and an output of second flip flop 205 is coupled to an input of clocked delay unit 207. An output of clocked delay unit 207 is coupled to AND gate 209. The output of AND gate 209 is coupled to counter 211. Ramp circuit 215 is coupled to a first input of comparator 213, and a bitline ("Vpixel") is coupled to a second input of comparator 213. Counter 211 is coupled to receive a reset signal before counting events (e.g., before first and before second ramps in FIG. 1).

As stated circuit diagram 201A may generate the count_en and ramp_en signals in FIG. 1. The synchronized ramp_eni is delayed (using clocked delay unit 207) by a number of system clock cycles defined by register reg_dly<k:0> (which may be included in clocked delay unit 207). The system clock sys_clk is a lower frequency clock compared with count_clk_i. The register is adjusted accordingly so counter 211 is started later than when the ramp starts. The register value can be determined through chip testing, and the value can be stored in one-time-programmable memory. The number of flip-flops inside the clocked delay unit 207 is the maximum of system clock cycles that can delay the counter. Many flip flops may be required for longer delay.

Figure 2B:
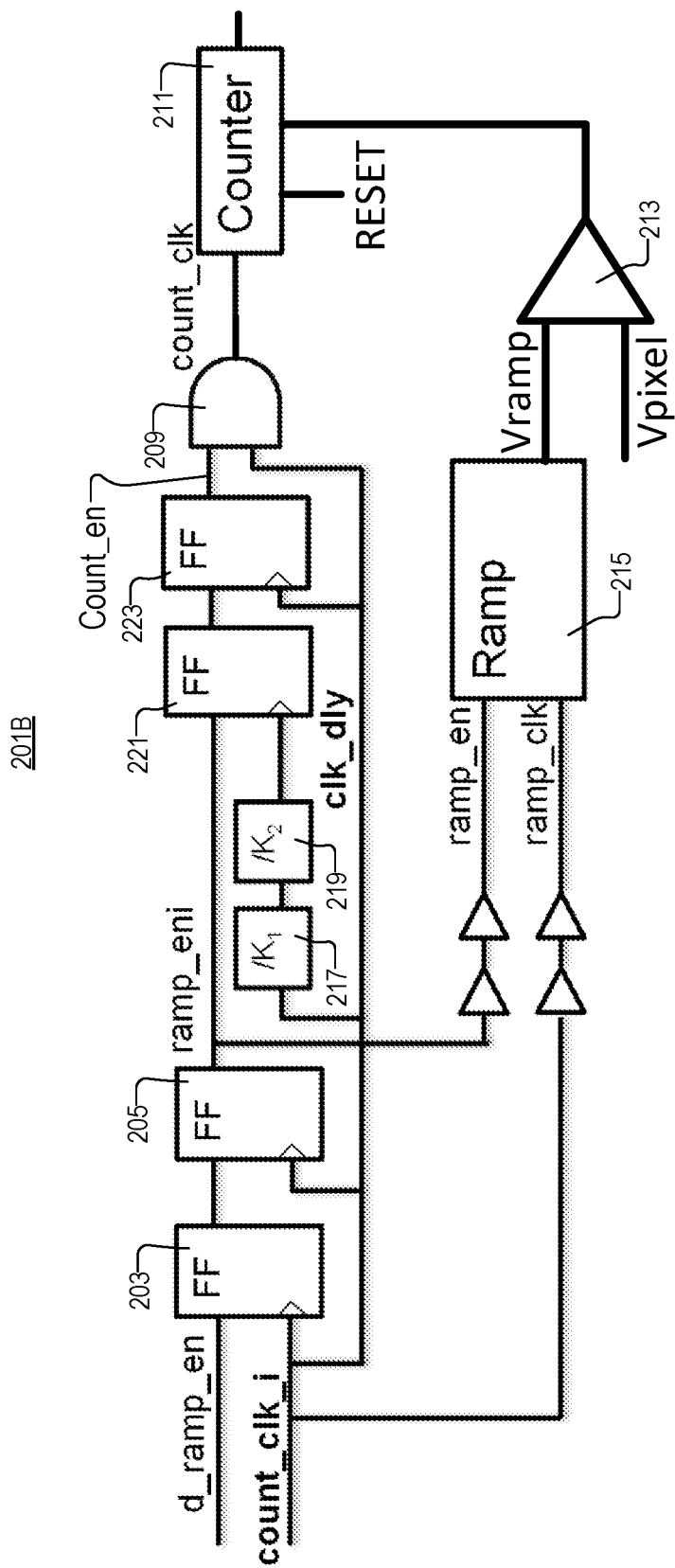
FIG. 2B shows part of an analog to digital converter circuit which may generate the waveforms of FIG. 1, in accordance with the teachings of the present disclosure.

FIG. 2B shows part of an analog to digital converter circuit 201B, which may generate the waveforms of FIG. 1, in accordance with the teachings of the present disclosure. As shown, analog to digital converter circuit 201B includes first flip flop 203, second flip flop 205, AND gate 209, counter 211, comparator 213, ramp circuit 215, first divider 217, second divider 219, third flip flop 221, and fourth flip flop 223. An output of first flip flop 203 is coupled to an input of second flip flop 205, and an output of second flip flop 205 is coupled to an input of third flip flop 221. First divider 217 and second divider 219 are coupled to an input of third flip flop 221. An output of third flip flop 221 is coupled to an input of fourth flip flop 223, and an output of fourth flip flop 223 is coupled to AND gate 209. The output of AND gate 209 is coupled to counter 211. Ramp circuit 215 is coupled to a first input of comparator 213, and a bitline ("Vpixel") is coupled to a second input of comparator 213. Counter 211 is coupled to receive a reset signal before counting events (e.g., before first and before second ramps in FIG. 1).

As shown, instead of using a delay unit (e.g., clocked delay unit 207 FIG. 2A), the system here uses dividers (e.g., dividers 217 and 219) to achieve similar functionality, and the number of stages is reduced. The system may divide the clock by $K_1$=1,2,3,4, and $K_2$=1,2,3,4. $K_1$ and $K_2$ can be adjusted to delay count_clk by desired clock cycles to save power. The divided clock clk_dly is used to synchronize ramp_eni. Fourth flip flop 223 is clocked by clk_div to have a synchronized count_clk so that the delay between count_clk and ramp_en is well defined. The delay may be $(K_1*K_2+1)*Tclk$.

In one example, a histogram algorithm block on-chip may be used to produce the delay for count_en (which may be calculated dynamically) instead of using one-time-programmable memory to store the register values based on chip tests. Extra optical black rows (including black pixels—e.g., pixels where light is blocked from reaching the pixel) are used for black level calibration (BLC), and the data of these extra rows are used to determine the minimum count. In some examples, the system may only apply a delayed count_en for normal BLC and image rows. One benefit of this approach is that count_en can be adjusted dynamically, but it also consumes extra power.

Figure 3:
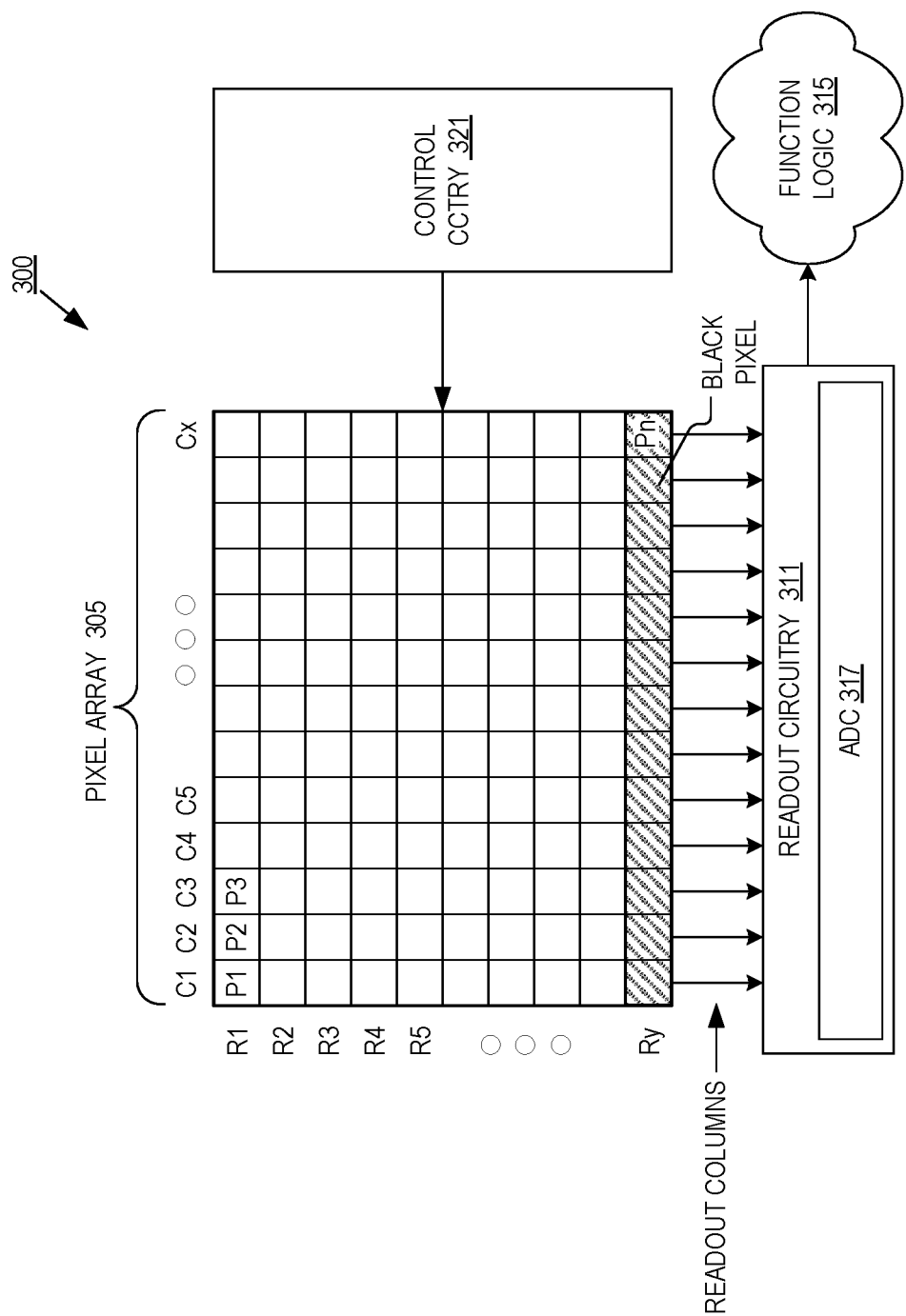
FIG. 3 depicts a block diagram of an imaging system, in accordance with the teachings of the present disclosure.

FIG. 3 depicts a block diagram of an imaging system 300, in accordance with the teachings of the present disclosure. Imaging system 300 includes pixel array 305, control circuitry 321, readout circuitry 311 (including analog to digital converters 317), and function logic 315. In one example, pixel array 305 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 305 has acquired its image data or image charge, the image data is readout by readout circuitry 311 and then transferred to function logic 315. In various examples, readout circuitry 311 may include amplification circuitry, analog to digital conversion 317 circuitry (e.g., analog to digital conversion circuitry from FIG. 2A, FIG. 2B, etc.), and the like. Function logic 315 may simply store the image data or even manipulate the image data by applying post image effects (e.g., crop, rotate, remove red eye, adjust brightness, adjust contrast, or otherwise). In one example, readout circuitry 311 may readout a row of image data at a time along readout column lines (illustrated) or may readout the image data using a variety of other techniques (not illustrated), such as a serial readout or a full parallel readout of all pixels simultaneously.

In one example, control circuitry 321 is coupled to pixel array 305 to control operation of the plurality of photodiodes in pixel array 305. For example, control circuitry 321 may generate a shutter signal for controlling image acquisition. In one example, the shutter signal is a global shutter signal for simultaneously enabling all pixels within pixel array 305 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

As shown, the image sensor may include one or more rows of black pixels (e.g., pixels that are prevented from receiving light by virtue of a metal shield or the like), and a length of a delay between starting the ramp signal and starting the counter may be determined dynamically by reading out a black pixel voltage from the one or more black pixels.

In one example, imaging system 300 may be included in an automobile or the like. Additionally, imaging system 300 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 300, extract image data from imaging system 300, or manipulate image data supplied by imaging system 300.

Figure 4:
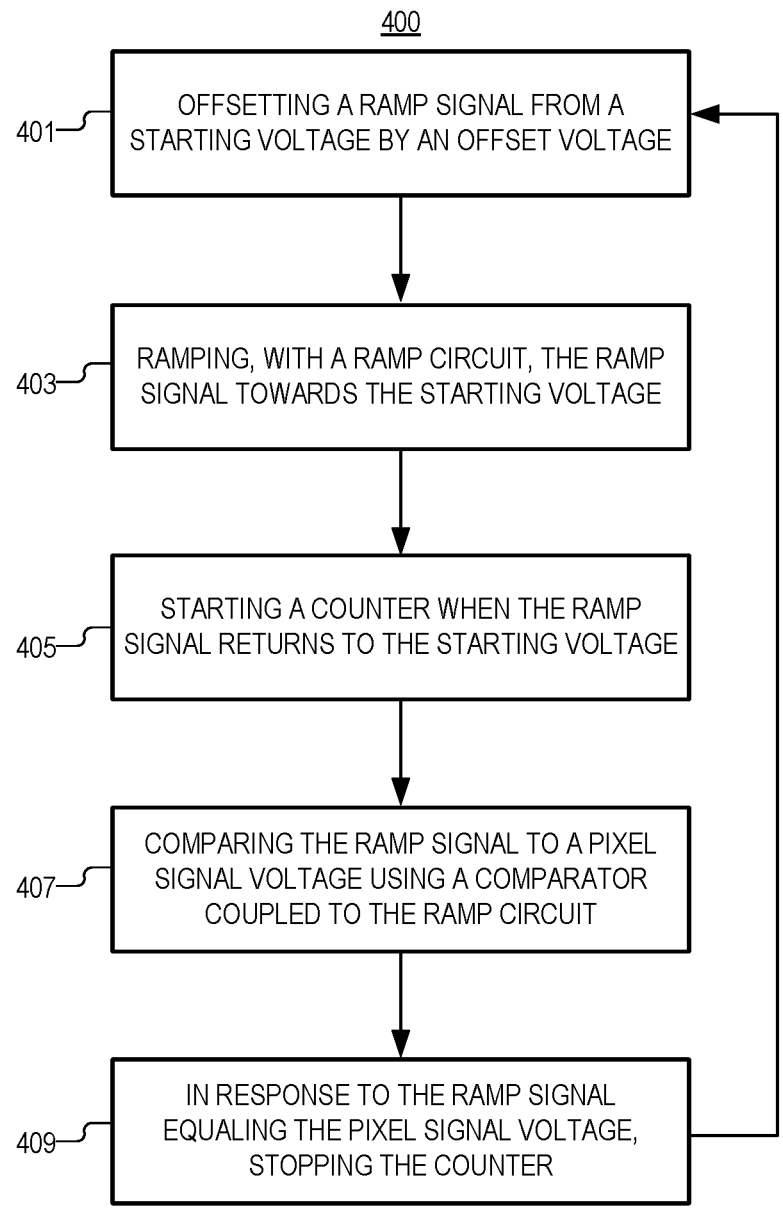
FIG. 4 depicts a method of analog to digital conversion, in accordance with the teachings of the present disclosure.

FIG. 4 illustrates an example method 400 of analog to digital conversion, in accordance with the teachings of the present disclosure. The order in which some or all process blocks appear in method 400 should not be deemed limiting. Rather, one of ordinary skill in the art having the benefit of the present disclosure will understand that some of method 400 may be executed in a variety of orders not illustrated, or even in parallel. Furthermore, method 400 may omit certain process blocks in order to avoid obscuring certain aspects. Alternatively, method 400 may include additional process blocks that may not be necessary in some embodiments/examples of the disclosure.

Block 401 illustrates offsetting a ramp signal from a starting voltage by an offset voltage. As stated above, the ramp signal is substantially linear but there may be a nonlinear portion at a beginning of the ramp signal (due to comparator and ramp delay). Accordingly, the offset voltage is of a magnitude so that the ramp signal becomes substantially linear prior to the ramp signal returning to the starting voltage.

Block 403 illustrates ramping, with a ramp circuit, the ramp signal towards the starting voltage. This may include ramping in either positive or negative directions.

Block 405 shows starting a counter after the ramp signal returns to the starting voltage. In one example, the length of the delay between starting ramping the ramp signal and starting the counter is programmed into one-time-programmable memory (e.g., static memory). In other examples, the length of the delay between starting ramping the ramp signal and starting the counter is determined dynamically by reading out a black pixel voltage from one or more black pixels. In this example, the black pixel voltage is used to form a histogram of black pixel voltage data, and the histogram of black pixel voltage data is used (e.g., by taking the median, average, high, or low value of the histogram) to dynamically determine the length of the delay.

Block 407 depicts comparing the ramp signal to a pixel signal voltage using a comparator coupled to the ramp circuit. The first pixel signal voltage read from the bitline may be a black level reference voltage (e.g., the voltage read out of a pixel that has been reset and has not generated image charge).

Block 409 shows in response to the ramp signal equaling the pixel signal voltage, stopping the counter. Thus, the system has established a digital value for the pixel signal voltage.

As shown, method 400 repeats itself to read out the pixel signal voltage for a second time (i.e., reading out a second pixel signal voltage; see e.g., second ramp of FIG. 1). The second pixel signal voltage is an image signal voltage (e.g., the voltage read out of a pixel that has generated image charge). Put another way, a second ramp signal (see e.g., second ramp signal in FIG. 1) may be offset from the starting voltage by the offset voltage, and the second ramp signal may be ramped towards the starting voltage. The counter is started when the second ramp signal returns to the starting voltage, and the second ramp signal is compared to a second pixel signal voltage (e.g., the image signal voltage) using the comparator. In response to the second ramp signal equaling the second pixel signal voltage, the counter is stopped.

Once the method 400 repeats itself, the first pixel signal voltage (e.g., the black level reference voltage) may be subtracted from the second pixel signal voltage (e.g., the image signal voltage) to perform black level correction. As shown in FIG. 1 the second pixel signal voltage has a greater absolute magnitude than the pixel signal voltage.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An analog to digital conversion (ADC) circuit, comprising:
   a ramp circuit coupled to output a ramp signal, wherein the ramp signal is offset from a starting voltage by an offset voltage, and wherein the ramp signal, after being offset from the starting voltage by the offset voltage, ramps down towards and past the starting voltage;
   a counter circuit coupled to the ramp circuit to start counting after the ramp signal returns to the starting voltage; and
   a comparator coupled to the counter circuit and a bitline to compare the ramp signal to a pixel signal voltage on the bitline, and in response to the ramp signal equaling the pixel signal voltage, stop the counter.

2. The ADC circuit of claim 1, wherein the pixel signal voltage is a black level reference voltage.

3. The ADC circuit of claim 2, wherein:
   a second ramp signal, output from the ramp circuit, is offset from the starting voltage by the offset voltage, and wherein the second ramp signal ramps towards the starting voltage;
   the counter circuit starts counting when the second ramp signal returns to the starting voltage; and
   the comparator compares the second ramp signal to a second pixel signal voltage on the bitline, and in response to the second ramp signal equaling the second pixel signal voltage, the comparator stops the counter.

4. The ADC circuit of claim 3, wherein the second pixel signal voltage is an image signal voltage, and wherein the second pixel signal voltage has a greater absolute magnitude than the pixel signal voltage and occurs after the pixel signal voltage.

5. The ADC circuit of claim 1, further comprising circuitry coupled to supply a length of a delay between starting the ramp signal and starting the counter.

6. The ADC circuit of claim 5, wherein the circuitry includes at least one of:
a clock delay unit where the length of the delay is stored in one-time-programmable memory; or
one or more dividers coupled to provide the length of the delay.

7. The ADC circuit of claim 1, wherein the bitline is coupled to individual pixels in an image sensor.

8. The ADC circuit of claim 1, wherein the image sensor includes one or more black pixels, and wherein a length of a delay between starting the ramp signal and starting the counter is determined dynamically by reading out a black pixel voltage from the one or more black pixels.

9. The ADC circuit of claim 8, wherein the black pixel voltage is used to form a histogram of black pixel voltage data, and wherein the histogram of black pixel voltage data is used to dynamically determine the length of the delay.

10. The ADC circuit of claim 1, wherein the ramp signal is substantially linear with a nonlinear portion at a beginning of the ramp signal, and wherein the offset voltage is of a magnitude so the ramp signal becomes substantially linear prior to the ramp signal returning to the starting voltage.

11. A method of analog to digital conversion, comprising:
offsetting a ramp signal from a starting voltage by an offset voltage;
after offsetting a ramp signal from the starting voltage by the offset voltage, ramping down, with a ramp circuit, the ramp signal towards and past the starting voltage;
starting a counter after the ramp signal returns to the starting voltage;
comparing the ramp signal to a pixel signal voltage using a comparator coupled to the ramp circuit; and
in response to the ramp signal equaling the pixel signal voltage, stopping the counter.

12. The method of claim 11, wherein the pixel signal voltage is a black level reference voltage.

13. The method of claim 12, further comprising:
offsetting a second ramp signal from the starting voltage by the offset voltage;
ramping, with the ramp circuit, the second ramp signal towards the starting voltage;
starting the counter when the second ramp signal returns to the starting voltage;
comparing the second ramp signal to a second pixel signal voltage using the comparator; and
in response to the second ramp signal equaling the second pixel signal voltage, stopping the counter.

14. The method of claim 13, wherein the second pixel signal voltage is an image signal voltage, wherein the second pixel signal voltage has a greater absolute magnitude than the pixel signal voltage and occurs after the pixel signal voltage.

15. The method of claim 11, further comprising subtracting the pixel signal voltage from the second pixel signal voltage to perform black level correction.

16. The method of claim 11, wherein a length of a delay between starting ramping the ramp signal and starting the counter is programmed into one-time-programmable memory.

17. The method of claim 11, wherein a length of a delay between starting ramping the ramp signal and starting the counter is determined dynamically by reading out a black pixel voltage from one or more black pixels.

18. The method of claim 17, wherein the black pixel voltage is used to form a histogram of black pixel voltage data, and wherein the histogram of black pixel voltage data is used to dynamically determine the length of the delay.

19. The method of claim 11, wherein the ramp signal is substantially linear with a nonlinear portion at a beginning of the ramp signal, and wherein the offset voltage is of a magnitude so the ramp signal becomes substantially linear prior to the ramp signal returning to the starting voltage.

20. The method of claim 11, wherein the comparator is coupled to a bitline of an image sensor to compare the ramp signal to the pixel signal voltage.

* * * * *